United States Patent
Choi

(10) Patent No.: US 8,994,192 B2
(45) Date of Patent: Mar. 31, 2015

(54) INTEGRATED CIRCUIT PACKAGING SYSTEM WITH PERIMETER ANTIWARPAGE STRUCTURE AND METHOD OF MANUFACTURE THEREOF

(75) Inventor: DaeSik Choi, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 32 days.

(21) Appl. No.: 13/327,651

(22) Filed: Dec. 15, 2011

(65) Prior Publication Data
US 2013/0154116 A1 Jun. 20, 2013

(51) Int. Cl.
*H01L 23/48* (2006.01)
*H01L 23/52* (2006.01)
*H01L 29/40* (2006.01)
*H01L 23/498* (2006.01)
*H01L 23/00* (2006.01)
*H01L 25/10* (2006.01)

(52) U.S. Cl.
CPC ........ *H01L 23/49816* (2013.01); *H01L 23/562* (2013.01); *H01L 25/105* (2013.01); *H01L 2224/16225* (2013.01); *H01L 2224/32225* (2013.01); *H01L 2224/73204* (2013.01); *H01L 2225/1023* (2013.01); *H01L 2225/1058* (2013.01); *H01L 2924/00012* (2013.01); *H01L 2924/15311* (2013.01); *H01L 2924/15331* (2013.01); *H01L 2924/3511* (2013.01)
USPC ............ 257/778; 257/777; 438/108; 438/127

(58) Field of Classification Search
CPC ................. H01L 2924/00; H01L 2224/48227; H01L 2224/48465; H01L 2224/73265; H01L 2224/73253; H01L 2224/97; H01L 2224/73203; H01L 23/3128; H01L 2924/19107; H01L 25/0657; H01L 2924/14; H01L 24/16; H01L 25/0652; H01L 2225/1058; H01L 24/29
USPC ................. 257/334, 663, 690, 693, 738, 778, 257/779–786, E21.001, E21.503, E21.502, 257/E21.499, E21.506, E21.509, E21.511, 257/E23.141; 438/6, 15, 25, 26, 51, 55, 64, 438/106, 111, 123, 124, 127–132, 464, 598, 438/612, 618
See application file for complete search history.

(56) References Cited

U.S. PATENT DOCUMENTS

| | | | |
|---|---|---|---|
| 6,224,711 B1 * | 5/2001 | Carden et al. | 156/311 |
| 6,400,033 B1 | 6/2002 | Darveaux | |
| 7,053,493 B2 | 5/2006 | Kanda et al. | |
| 7,279,789 B2 | 10/2007 | Cheng | |
| 8,021,930 B2 | 9/2011 | Pagaila | |
| 2007/0273019 A1 | 11/2007 | Huang et al. | |
| 2007/0290376 A1 * | 12/2007 | Zhao et al. | 257/787 |
| 2008/0054494 A1 * | 3/2008 | Chen et al. | 257/787 |
| 2008/0283994 A1 | 11/2008 | Tsai et al. | |
| 2009/0039490 A1 | 2/2009 | Fan | |
| 2009/0236731 A1 | 9/2009 | Shim et al. | |
| 2010/0301469 A1 * | 12/2010 | Choi et al. | 257/693 |

OTHER PUBLICATIONS

U.S. Appl. No. 12/875,998, Sep. 3, 2010, Yang et al.

* cited by examiner

*Primary Examiner* — Colleen A Matthews
*Assistant Examiner* — Junaiden Mirslalahuddin
(74) *Attorney, Agent, or Firm* — Ishimaru & Associates LLP

(57) ABSTRACT

A method of manufacture of an integrated circuit packaging system comprising: providing a package carrier; mounting an integrated circuit to the package carrier; and forming a perimeter antiwarpage structure on and along a perimeter of the package carrier.

10 Claims, 11 Drawing Sheets

US 8,994,192 B2

INTEGRATED CIRCUIT PACKAGING SYSTEM WITH PERIMETER ANTIWARPAGE STRUCTURE AND METHOD OF MANUFACTURE THEREOF

TECHNICAL FIELD

The present invention relates generally to an integrated circuit packaging system, and more particularly to a system for stacking packages.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

As the outline of these POP designs becomes smaller they are more susceptible to warpage during the solder reflow process. The heat necessary to reflow the solder can cause the package substrate to warp and deform. With ball grid array (BGA) packages this is a critical problem because of the number of connections between the package and PCB.

Thus, a need still remains for an integrated circuit packaging system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package carrier; mounting an integrated circuit to the package carrier; and forming a perimeter antiwarpage structure on and along a perimeter of the package carrier.

The present invention provides an integrated circuit packaging system, including: a package carrier; an integrated circuit mounted to the package carrier; and a perimeter antiwarpage structure formed on and along a perimeter of the package carrier.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
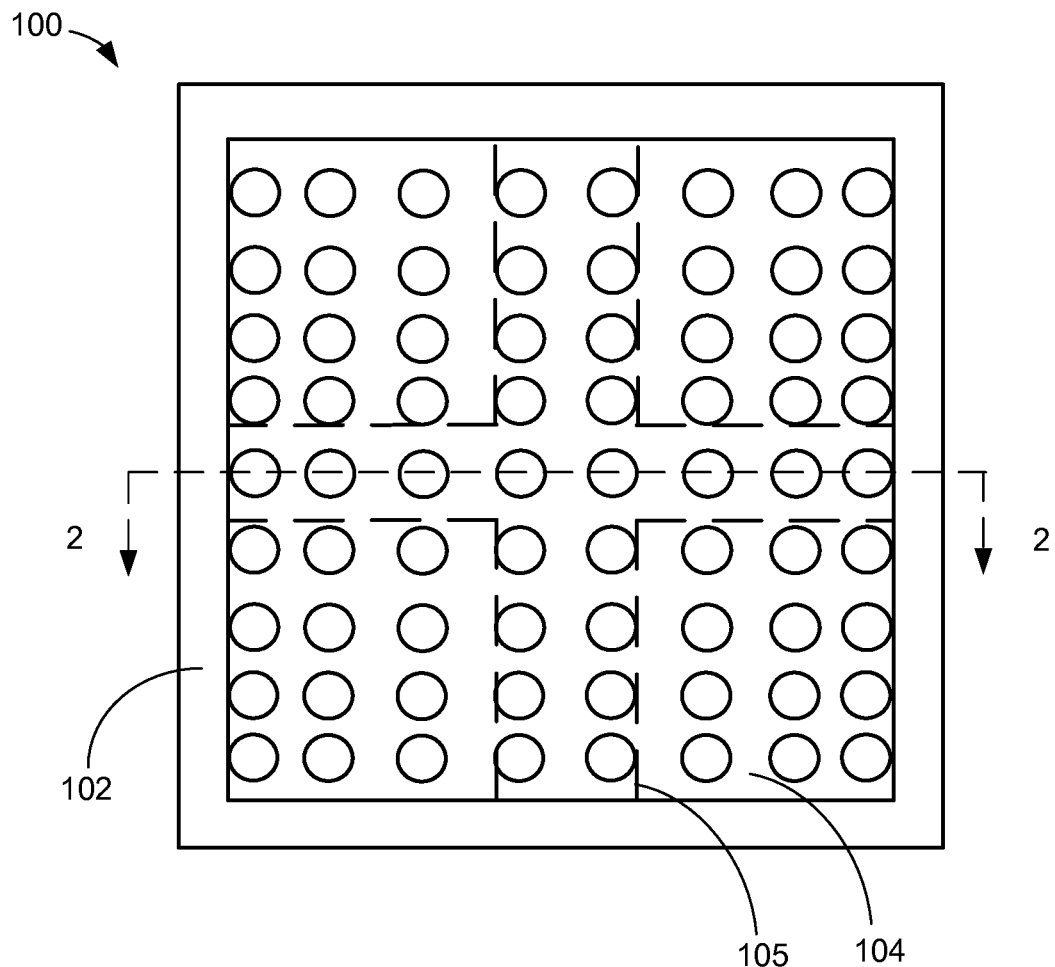
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The integrated circuit packaging system 100 can have a perimeter antiwarpage structure 102. The perimeter antiwarpage structure 102 is defined as a formed structure that is along the perimeter or a portion of the perimeter of a package carrier 104. The perimeter antiwarpage structure 102 is formed on the package carrier 104. In this embodiment the perimeter antiwarpage structure 102 is formed along the entire perimeter of the package carrier 104.

In addition, the perimeter antiwarpage structure 102 can have a center cross support 105 to provide center support for the integrated packaging system 100. The center cross support 105 is depicted by dashed lines and can be integral to the perimeter portion of the perimeter antiwarpage structure 102. The center cross support 105 can be made from the same material as the perimeter antiwarpage structure 102.

Figure 2:
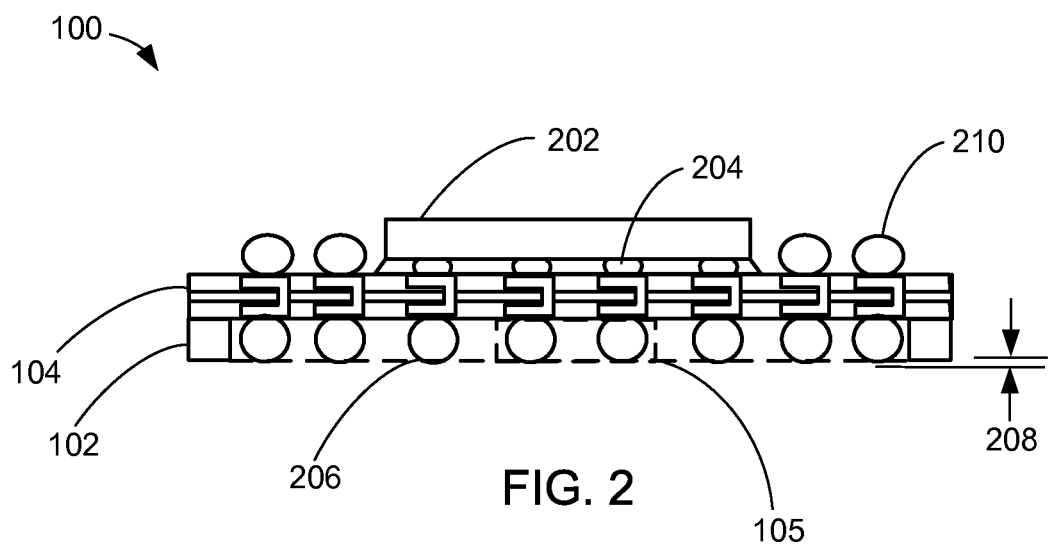
FIG. 2 is a cross-sectional view of an integrated circuit packaging system along a line 2-2 of FIG. 1.

The package carrier 104 is defined as a support structure providing a mounting structure to the internal contents of the integrated circuit packaging system 100 as well as conductive paths within, to, and out of the integrated circuit packaging system 100. As examples, the package carrier 104 can be a laminated substrate, a ceramic substrate, or a leadframe type carrier Referring now to FIG. 2, therein is shown a cross-sectional view of an integrated circuit packaging system 100 along a line 2-2 of FIG. 1. An integrated circuit 202 is mounted to and over the package carrier 104. The integrated circuit 202 is defined as an active device having active circuitry fabricated thereon. Examples for the integrated circuit 202 can include an integrated circuit die, a packaged integrated circuit, a wafer chip scale package, or a flip chip.

The integrated circuit 202 can be attached to the package carrier 104 using integrated circuit electrical connectors 204. The integrated circuit electrical connectors 204 are defined as connection structures to electrically and mechanically connect and attach the integrated circuit 202 to the next system level. Examples of the integrated circuit electrical connectors 204 include solder bumps, conductive paste, or conductive posts.

The integrated circuit packaging system 100 can be attached to a printed circuit board (PCB) (not shown) using external connectors 206. The external connectors 206 are defined as connection structures to electrically and mechanically connect and attach the integrated circuit packaging system 100 to the next system level. Examples of external connectors 206 include solder bumps, conductive paste, or conductive posts.

The external connectors 206 can be formed such that they extend below a bottom 208 of the surface of the perimeter antiwarpage structure 102 and the center cross support 105. When the integrated circuit packaging system 100 is mechanically and electrically attached to the PCB using a reflow process, the external connectors 206 can deform allowing the perimeter antiwarpage structure 102 and the center cross support 105 to be in direct physical contact with the PCB at the same time the external connectors 206 provide a mechanical and electrical connection with the PCB and integrated circuit packaging system 100. The perimeter antiwarpage structure 102 and the external connectors 206 are on the side of the package carrier 104 opposite from the integrated circuit 202 and with a border of the perimeter antiwarpage structure 102. The integrated circuit 202 is mounted to one side of the package carrier 104 with the integrated circuit electrical connectors 204. The perimeter antiwarpage structure 102 is on another side of the package carrier 104 that is facing away from the integrated circuit. The external connectors 206 are on a side of the package carrier 104 facing away from the integrated circuit 202. The external connectors 206 are electrically connected to the integrated circuit electrical connectors on the opposite side of the package carrier 104. The perimeter antiwarpage structure 102 is formed external to the package carrier 104. The perimeter antiwarpage structure 102 is mounted on the surface of the package carrier 104.

Package interconnects 210 can be attached to the package carrier 104. The package interconnects 210 are defined as connection structures to electrically and mechanically connect and attach the integrated circuit packaging system 100 to the next system level. Examples of package interconnects 210 include solder bumps, conductive paste, or conductive posts.

It has been discovered that the addition of the perimeter antiwarpage structure 102 formed along the entire perimeter of the package carrier 104 and the center cross support 105 greatly increases the structural rigidity and therefore the reliability of the integrated circuit packaging system 100 and the mechanical and electrical connection between the integrated circuit packaging system 100 and the PCB.

Figure 3:
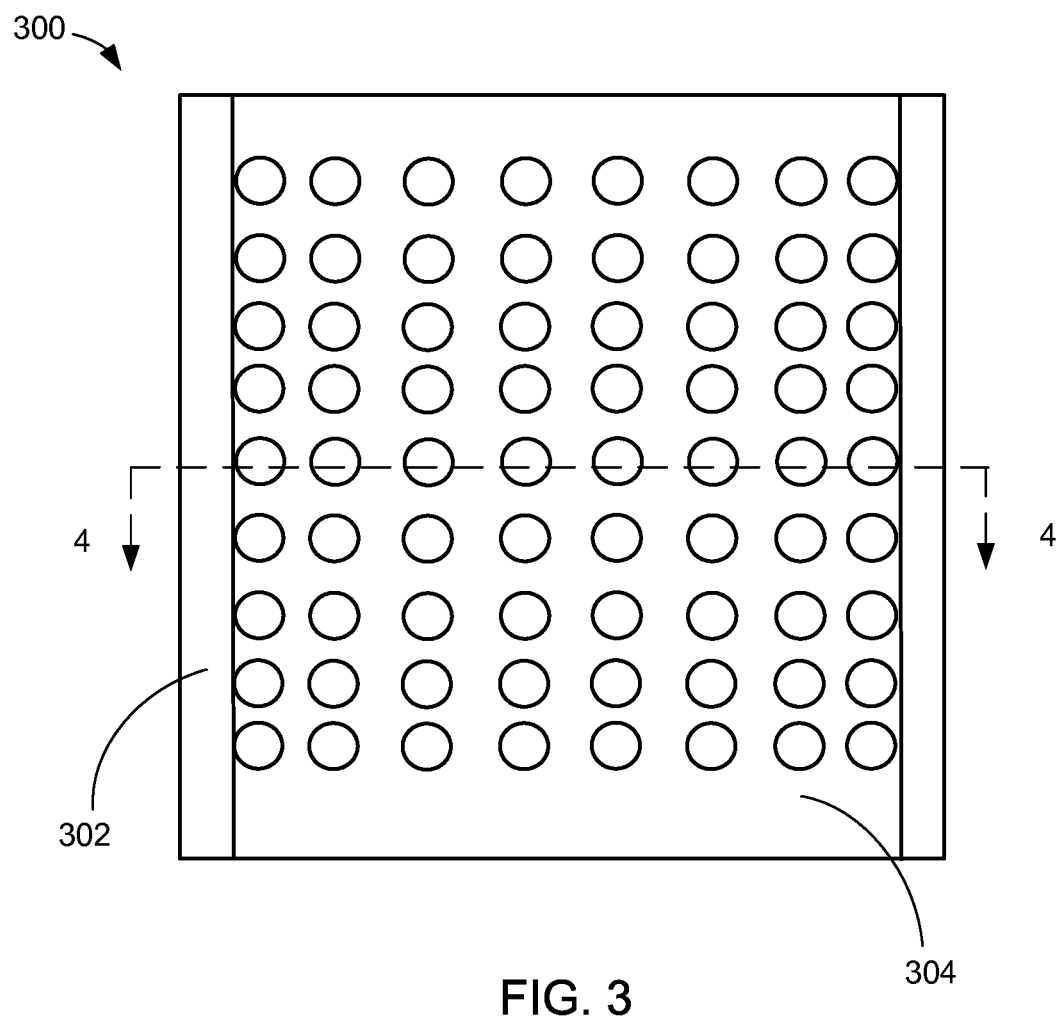
FIG. 3 is a bottom view of an integrated circuit packaging system in a second embodiment of the present invention.

Referring now to FIG. 3, therein is shown a bottom view of an integrated circuit packaging system 300 in a second embodiment of the present invention. The integrated circuit packaging system 300 can have a perimeter antiwarpage structure 302. The perimeter antiwarpage structure 302 is defined as a formed structure that is along the perimeter or a portion of the perimeter of a package carrier 304. The perimeter antiwarpage structure 302 is formed on the package carrier 304. In this embodiment the perimeter antiwarpage structure 302 is formed on opposing sides of the package carrier 304.

Figure 4:
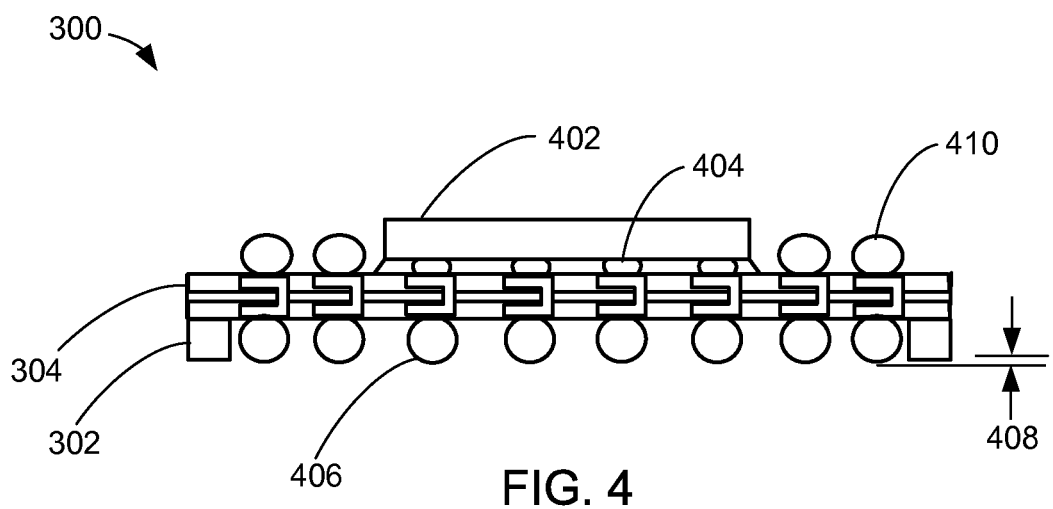
FIG. 4 is a cross-sectional view of an integrated circuit packaging system along a line 4-4 of FIG. 3.

The package carrier 304 is defined as a support structure providing a mounting structure to the internal contents of the integrated circuit packaging system 300 as well as conductive paths within, to, and out of the integrated circuit packaging system 300. As examples, the package carrier 304 can be a laminated substrate, a ceramic substrate, or a leadframe type carrier Referring now to FIG. 4, therein is shown a cross-sectional view of an integrated circuit packaging system 300 along a line 4-4 of FIG. 3. An integrated circuit 402 is mounted to and over the package carrier 304. The integrated circuit 402 is defined as an active device having active circuitry fabricated thereon. Examples for the integrated circuit 402 can include an integrated circuit die, a packaged integrated circuit, a wafer chip scale package, or a flip chip.

The integrated circuit 402 can be attached to the package carrier 304 using integrated circuit electrical connectors 404. The integrated circuit electrical connectors 404 are defined as connection structures to electrically and mechanically connect and attach the integrated circuit 402 to the next system level. Examples of the integrated circuit electrical connectors 404 include solder bumps, conductive paste, or conductive posts.

The integrated circuit packaging system 300 can be attached to a printed circuit board (PCB) (not shown) using external connectors 406. The external connectors 406 are defined as connection structures to electrically and mechanically connect and attach the integrated circuit packaging system 300 to the next system level. Examples of external connectors 406 include solder bumps, conductive paste, or conductive posts.

The external connectors 406 can be formed such that they extend below a bottom 408 of the surface of the perimeter antiwarpage structure 302. When the integrated circuit packaging system 300 is mechanically and electrically attached to the PCB using a reflow process, the external connectors 406 can deform allowing the perimeter antiwarpage structure 302 to be in direct physical contact with the PCB at the same time the external connectors 406 provide a mechanical and electrical connection with the PCB and integrated circuit packaging system 300.

Package interconnects 410 can be attached to the package carrier 304. The package interconnects 410 are defined as connection structures to electrically and mechanically connect and attach the integrated circuit packaging system 300 to the next system level. Examples of package interconnects 410 include solder bumps, conductive paste, or conductive posts.

It has been discovered that the addition of the perimeter antiwarpage structure 302 formed on opposing sides of the package carrier 304 greatly increases the structural rigidity and therefore the reliability of the integrated circuit packaging system 300 and the mechanical and electrical connection between the integrated circuit packaging system 300 and the PCB.

Figure 5:
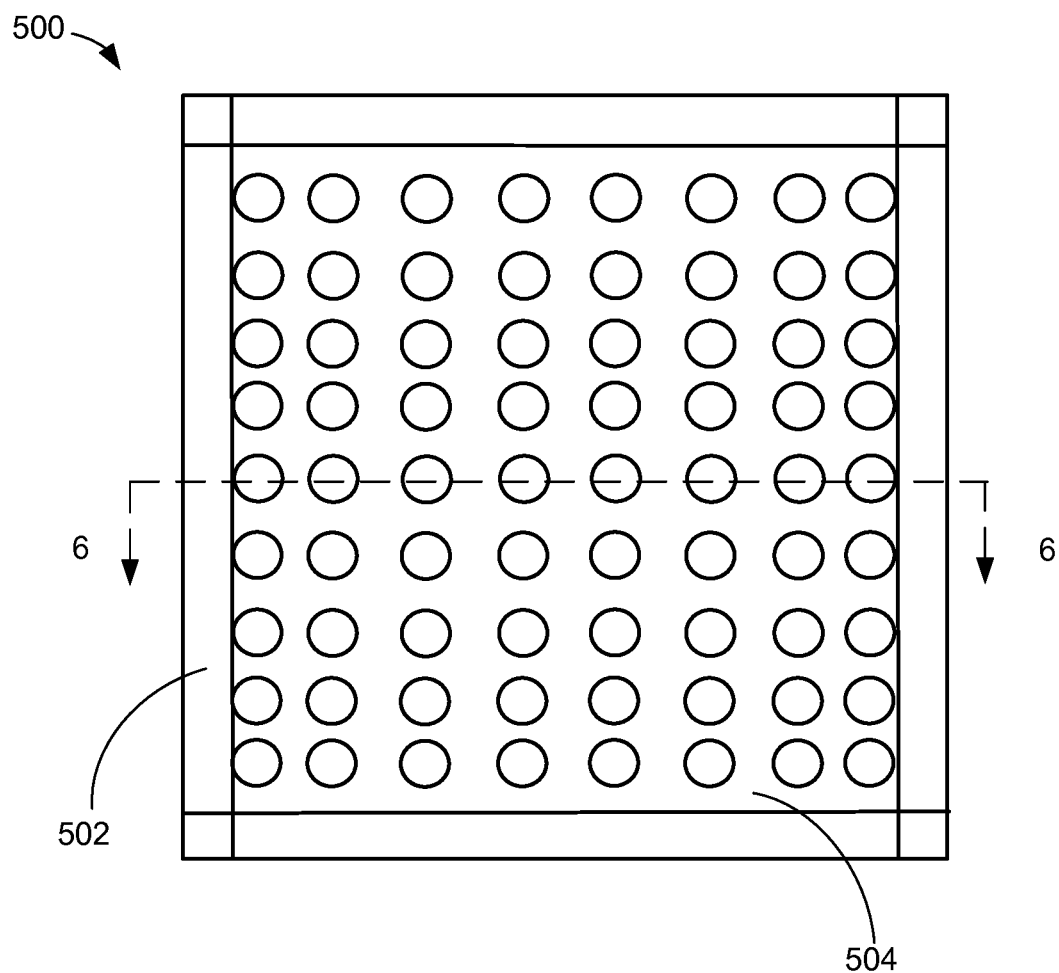
FIG. 5 is a bottom view of an integrated circuit packaging system in a third embodiment of the present invention.

Referring now to FIG. 5, therein is shown a bottom view of an integrated circuit packaging system 500 in a third embodiment of the present invention. The integrated circuit packaging system 500 can have a perimeter antiwarpage structure 502. The perimeter antiwarpage structure 502 is defined as a formed structure that is along the perimeter or a portion of the perimeter of a package carrier 504. The perimeter antiwarpage structure 502 is formed on the package carrier 504. In this embodiment the perimeter antiwarpage structure 502 is formed along the entire perimeter of the package carrier 502 and not in the corners.

Figure 6:
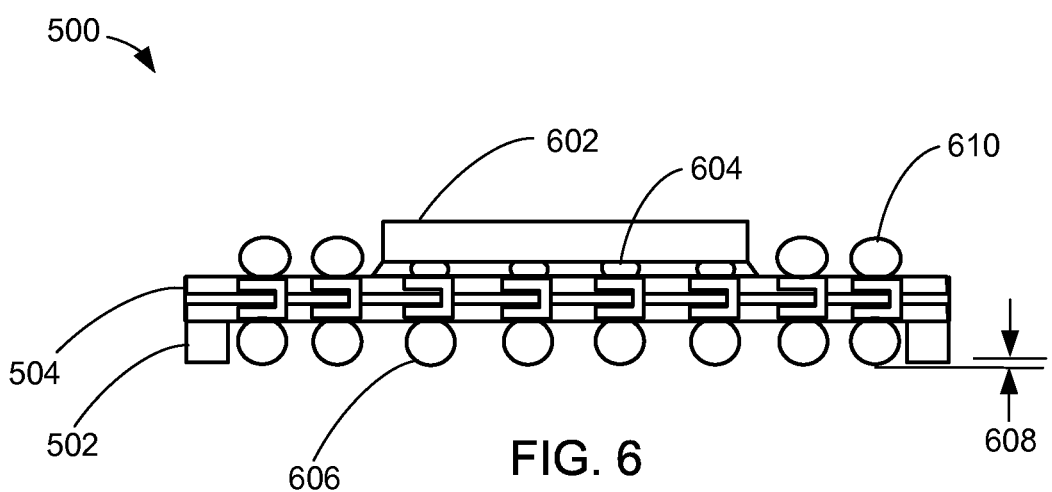
FIG. 6 is a cross-sectional view of an integrated circuit packaging system along a line 6-6 of FIG. 5.

The package carrier 504 is defined as a support structure providing a mounting structure to the internal contents of the integrated circuit packaging system 500 as well as conductive paths within, to, and out of the integrated circuit packaging system 500. As examples, the package carrier 504 can be a laminated substrate, a ceramic substrate, or a leadframe type carrier Referring now to FIG. 6, therein is shown a cross-sectional view of an integrated circuit packaging system 500 along a line 6-6 of FIG. 5. An integrated circuit 602 is mounted to and over the package carrier 504. The integrated circuit 602 is defined as an active device having active circuitry fabricated thereon. Examples for the integrated circuit 602 can include an integrated circuit die, a packaged integrated circuit, a wafer chip scale package, or a flip chip.

The integrated circuit 602 can be attached to the package carrier 504 using integrated circuit electrical connectors 604. The integrated circuit electrical connectors 604 are defined as connection structures to electrically and mechanically connect and attach the integrated circuit 602 to the next system level. Examples of the integrated circuit electrical connectors 604 include solder bumps, conductive paste, or conductive posts.

The integrated circuit packaging system 500 can be attached to a printed circuit board (PCB) (not shown) using external connectors 606. The external connectors 606 are defined as connection structures to electrically and mechanically connect and attach the integrated circuit packaging system 500 to the next system level. Examples of external connectors 606 include solder bumps, conductive paste, or conductive posts.

The external connectors 606 can be formed such that they extend below a bottom 608 of the surface of the perimeter antiwarpage structure 502. When the integrated circuit packaging system 500 is mechanically and electrically attached to the PCB using a reflow process, the external connectors 606 can deform allowing the perimeter antiwarpage structure 502 to be in direct physical contact with the PCB at the same time the external connectors 606 provide a mechanical and electrical connection with the PCB and integrated circuit packaging system 500.

Package interconnects 610 can be attached to the package carrier 504. The package interconnects 610 are defined as connection structures to electrically and mechanically connect and attach the integrated circuit packaging system 500 to the next system level. Examples of package interconnects 610 include solder bumps, conductive paste, or conductive posts.

It has been discovered that the addition of the perimeter antiwarpage structure 502 formed along the entire perimeter of the package carrier 504 and not in the corners greatly increases the structural rigidity and therefore reliability of the integrated circuit packaging system 500 and the mechanical and electrical connection between the integrated circuit packaging system 500 and the PCB.

Figure 7:
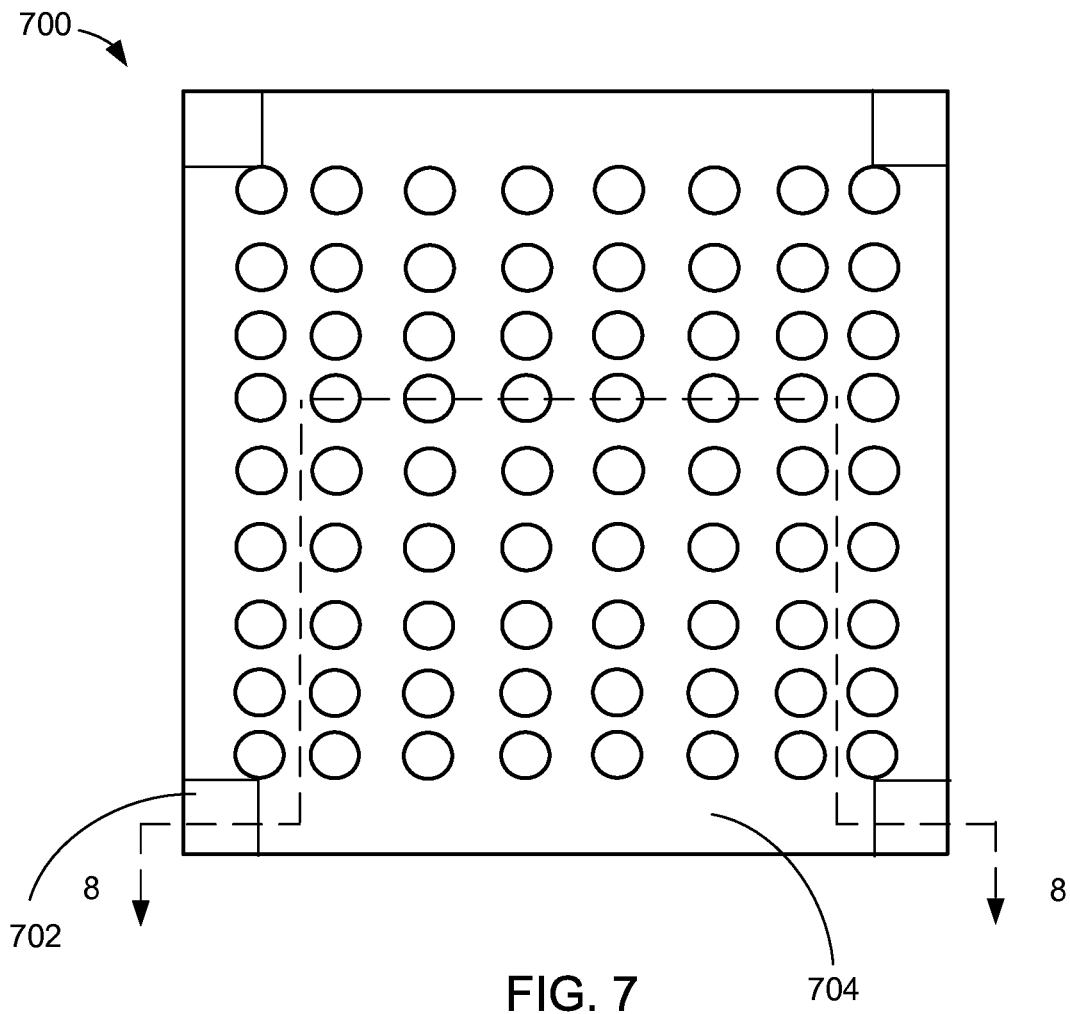
FIG. 7 is a bottom view of an integrated circuit packaging system in a fourth embodiment of the present invention.

Referring now to FIG. 7, therein is shown a bottom view of an integrated circuit packaging system 700 in a forth embodiment of the present invention. The integrated circuit packaging system 700 can have a perimeter antiwarpage structure 702. The perimeter antiwarpage structure 702 is defined as a formed structure that is along the perimeter or a portion of the perimeter of a package carrier 704. The perimeter antiwarpage structure 702 is formed on the package carrier 704. In this embodiment the perimeter antiwarpage structure 702 is formed in four corners of the package carrier 704.

Figure 8:
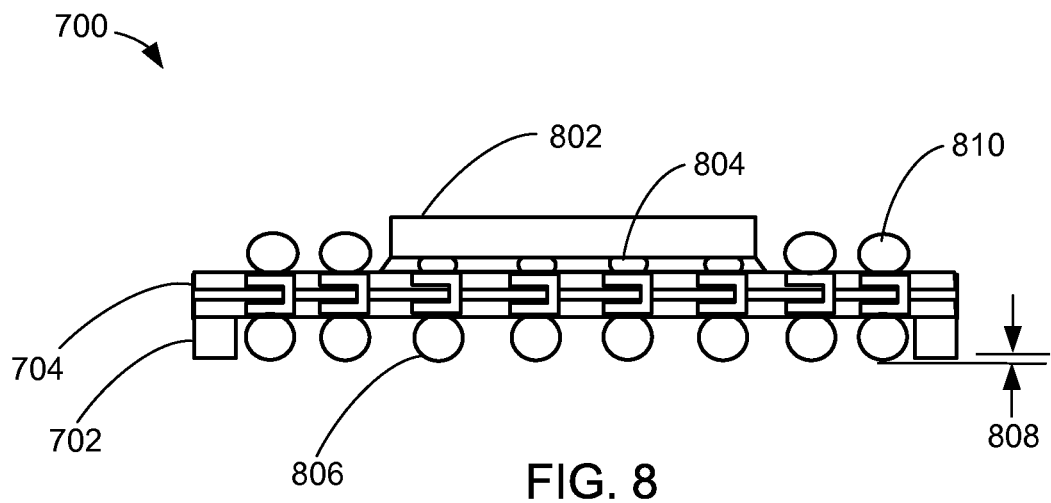
FIG. 8 is a cross-sectional view of an integrated circuit packaging system along a line 8-8 of FIG. 7.

The package carrier 704 is defined as a support structure providing a mounting structure to the internal contents of the integrated circuit packaging system 700 as well as conductive paths within, to, and out of the integrated circuit packaging system 700. As examples, the package carrier 704 can be a laminated substrate, a ceramic substrate, or a leadframe type carrier Referring now to FIG. 8, therein is shown a cross-sectional view of an integrated circuit packaging system 700 along a line 8-8 of FIG. 7. An integrated circuit 802 is mounted to and over the package carrier 704. The integrated circuit 802 is defined as an active device having active circuitry fabricated thereon. Examples for the integrated circuit 802 can include an integrated circuit die, a packaged integrated circuit, a wafer chip scale package, or a flip chip.

The integrated circuit 802 can be attached to the package carrier 704 using integrated circuit electrical connectors 804. The integrated circuit electrical connectors 804 are defined as connection structures to electrically and mechanically connect and attach the integrated circuit 802 to the next system level. Examples of the integrated circuit electrical connectors 804 include solder bumps, conductive paste, or conductive posts.

The integrated circuit packaging system 700 can be attached to a printed circuit board (PCB) (not shown) using external connectors 806. The external connectors 806 are defined as connection structures to electrically and mechanically connect and attach the integrated circuit packaging system 700 to the next system level. Examples of external connectors 806 include solder bumps, conductive paste, or conductive posts.

The external connectors 806 can be formed such that they extend below a bottom 808 of the surface of the perimeter antiwarpage structure 702. When the integrated circuit packaging system 700 is mechanically and electrically attached to the PCB using a reflow process, the external connectors 806 can deform allowing the perimeter antiwarpage structure 702 to be in direct physical contact with the PCB at the same time the external connectors 806 provide a mechanical and electrical connection with the PCB and integrated circuit packaging system 700.

Package interconnects 810 can be attached to the package carrier 704. The package interconnects 810 are defined as connection structures to electrically and mechanically connect and attach the integrated circuit packaging system 700 to the next system level. Examples of package interconnects 810 include solder bumps, conductive paste, or conductive posts.

It has been discovered that the addition of the perimeter antiwarpage structure 702 formed in four corners of the package carrier 704 greatly increases the structural rigidity and therefore reliability of the integrated circuit packaging system 700 and the mechanical and electrical connection between the integrated circuit packaging system 700 and the PCB.

Figure 9:
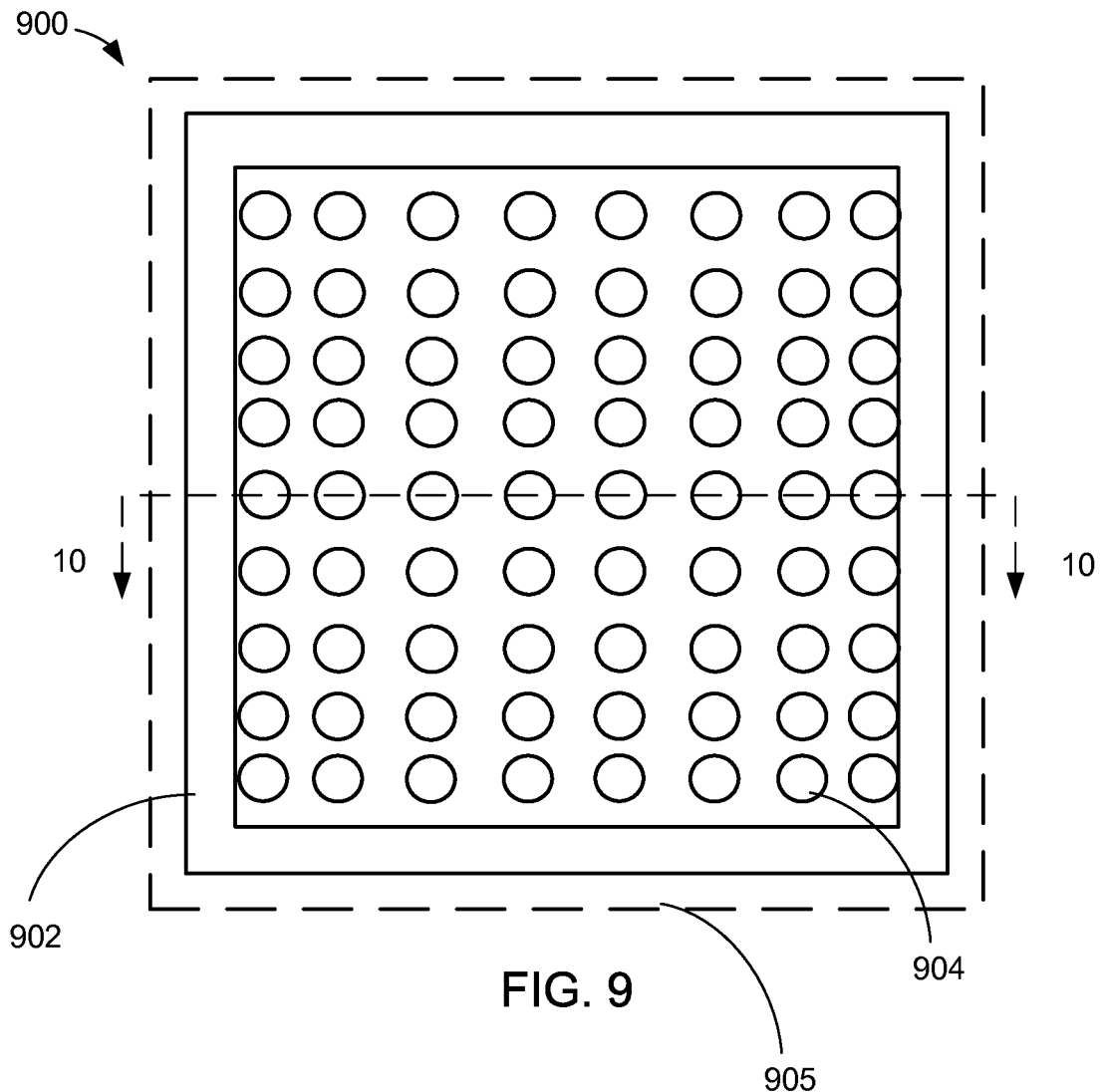
FIG. 9 is a bottom view of an integrated circuit packaging system in a fifth embodiment of the present invention.

Referring now to FIG. 9, therein is shown a bottom view of an integrated circuit packaging system 900 in a fifth embodiment of the present invention. The integrated circuit packaging system 900 can have a perimeter antiwarpage structure 902. The perimeter antiwarpage structure 902 is defined as a formed structure that is along the perimeter or a portion of the perimeter of a package carrier 904. The perimeter antiwarpage structure 902 is formed on the package carrier 904. In this embodiment the perimeter antiwarpage structure 902 is formed along the entire perimeter on both sides of the package carrier 904.

In addition the perimeter antiwarpage structure 902 can have a side support 905 to provide support to the side of the integrated packaging system 900. The side support 905 is depicted by dashed line. The side support 905 can be considered part of the perimeter antiwarpage structure 902 and extending laterally beyond the vertical edge of the package carrier 904. The side support 905 can be made from the same material as the perimeter antiwarpage structure 902.

Figure 10:
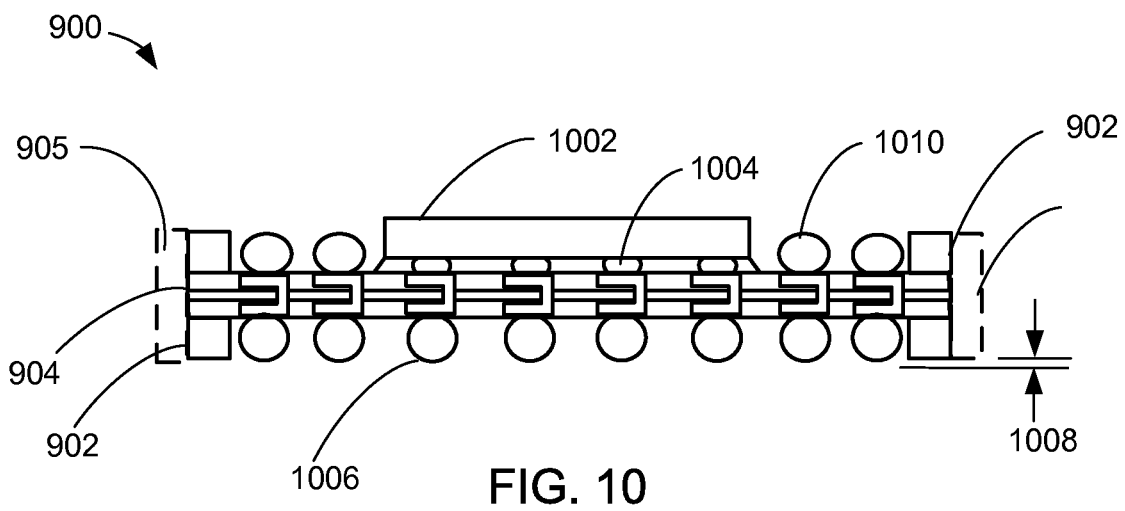
FIG. 10 is a cross-sectional view of an integrated circuit packaging system along a line 10-10 of FIG. 9.

The package carrier 904 is defined as a support structure providing a mounting structure to the internal contents of the integrated circuit packaging system 900 as well as conductive paths within, to, and out of the integrated circuit packaging system 900. As examples, the package carrier 904 can be a laminated substrate, a ceramic substrate, or a leadframe type carrier Referring now to FIG. 10, therein is shown a cross-sectional view of an integrated circuit packaging system 900 along a line 10-10 of FIG. 9. An integrated circuit 1002 is mounted to and over the package carrier 904. The integrated circuit 1002 is defined as an active device having active circuitry fabricated thereon. Examples for the integrated circuit 1002 can include an integrated circuit die, a packaged integrated circuit, a wafer chip scale package, or a flip chip.

The integrated circuit 1002 can be attached to the package carrier 904 using integrated circuit electrical connectors 1004. The integrated circuit electrical connectors 1004 are defined as connection structures to electrically and mechanically connect and attach the integrated circuit 1002 to the next system level. Examples of the integrated circuit electrical connectors 1004 include solder bumps, conductive paste, or conductive posts.

The integrated circuit packaging system 900 can be attached to a printed circuit board (PCB) (not shown) using external connectors 1006. The external connectors 1006 are defined as connection structures to electrically and mechanically connect and attach the integrated circuit packaging system 900 to the next system level. Examples of external connectors 1006 include solder bumps, conductive paste, or conductive posts.

The external connectors 1006 can be formed such that they extend below a bottom 1008 of the surface of the perimeter antiwarpage structure 902 and the side support 905. When the integrated circuit packaging system 900 is mechanically and electrically attached to the PCB using a reflow process, the external connectors 1006 can deform allowing the perimeter antiwarpage structure 902 and the side support 905 to be in direct physical contact with the PCB at the same time the external connectors 1006 provide a mechanical and electrical connection with the PCB and integrated circuit packaging system 900.

Package interconnects 1010 can be attached to the package carrier 904. The package interconnects 1010 are defined as connection structures to electrically and mechanically connect and attach the integrated circuit packaging system 900 to the next system level. Examples of package interconnects 1010 include solder bumps, conductive paste, or conductive posts.

It has been discovered that the addition of the perimeter antiwarpage structure 902 and the side support 905 formed along the entire perimeter on both sides of the package carrier 904 greatly increases the structural rigidity and therefore reliability of the integrated circuit packaging system 900 and the mechanical and electrical connection between the integrated circuit packaging system 900 and the PCB.

Figure 11:
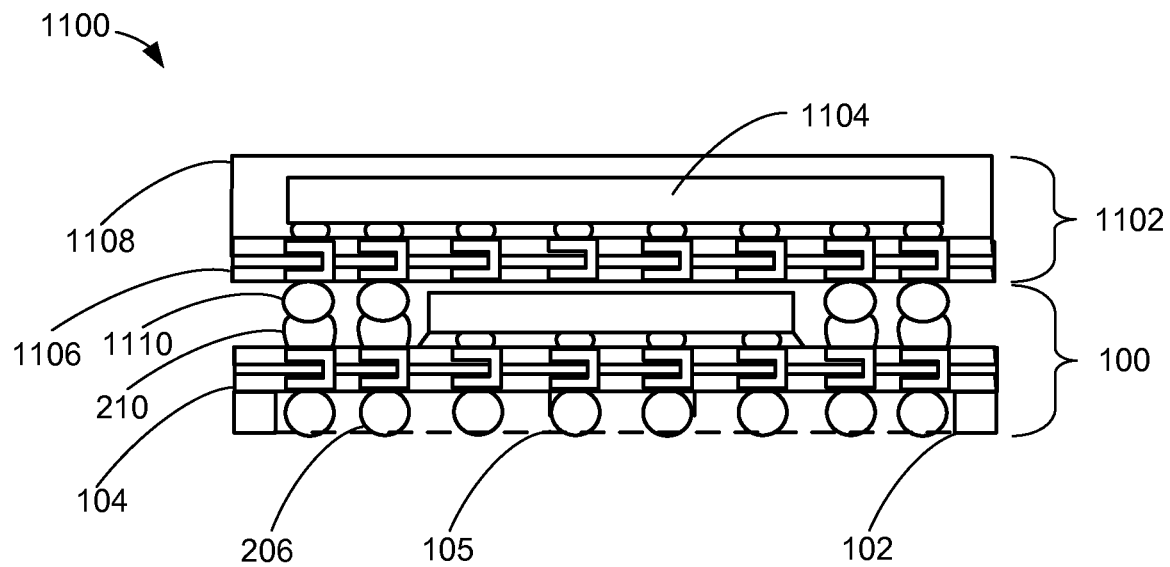
FIG. 11 is a cross-sectional view of an integrated circuit packaging system along a line 2-2 of FIG. 1 exemplified by the bottom view of FIG. 1 in a sixth embodiment of the present invention.

Referring now to FIG. 11, therein is shown a cross-sectional view of an integrated circuit packaging system 1100 along a line 2-2 of FIG. 1 exemplified by the bottom view of FIG. 1 in a sixth embodiment of the present invention. This embodiment shows the integrated circuit packaging system 100 with the addition of the mounting integrated circuit packaging system 1102, mounted above the integrated circuit packaging system 100 in a package on package configuration. The mounting integrated circuit packaging system 1102 includes an integrated circuit 1104, a package carrier 1106, and an encapsulation 1108.

The mounting integrated circuit package system 1102 can include mounting interconnects 1110 that are formed to coincide with package interconnects 210. The mounting interconnects 1110 are defined as connection structures to electrically and mechanically connect and attach the integrated circuit packaging system 100 and the mounting integrated circuit packaging system 1102. Examples of mounting interconnects 1110 include solder bumps, conductive paste, or conductive posts.

The integrated circuit packaging system 1100 can be attached to a printed circuit board (PCB) (not shown) using external connectors 206. When the integrated circuit packaging system 1100 is mechanically and electrically attached to the PCB using a reflow process, the external connectors 206 can deform allowing the perimeter antiwarpage structure 102 and the center cross support 105 to be in direct physical contact with the PCB at the same time the external connectors 206 provide a mechanical and electrical connection with the PCB and integrated circuit packaging system 1100.

The addition of the perimeter antiwarpage structure 102 and the center cross support 105 can provide several functions. The perimeter antiwarpage structure 102 and the center cross support 105 can add stiffness to the package carrier 104 during and after reflow of the external connectors 206. This stiffness minimizes the warpage of the package carrier 104 ensuring that the mechanical and electrical connection between the PCB and the integrated circuit packaging system 1100 is uniform. The perimeter antiwarpage structure 102 and the center cross support 105 can add an additional mechanical connection between the integrated circuit packaging system 1100 and the PCB. This additional mechanical connection minimizes warpage of the integrated circuit packaging system 1100 during the many thermal cycles that the PCB may experience, thereby minimizing any physical stress on the integrated circuit packaging system 1100 which can cause premature electrical failure.

It has been discovered that the addition of the perimeter antiwarpage structure 102 and the center cross support 105 greatly increases the reliability of the integrated circuit packaging system 1100 and the mechanical and electrical connection between the integrated circuit packaging system 1100 and the PCB. The antiwarpage structure 102 and the center cross support 105 attached to the integrated packaging system 100 increases the structural rigidity of the integrated packaging system 100 which in turn increases the structural rigidity of the integrated packaging system 1100.

Figure 12:
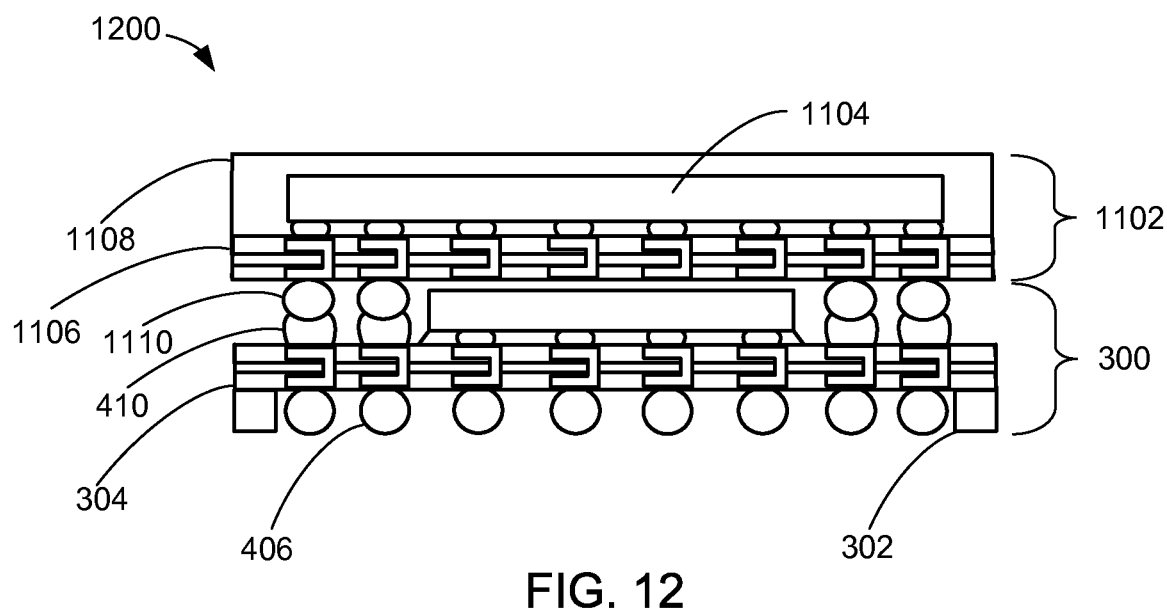
FIG. 12 is a cross-sectional view of an integrated circuit packaging system along a line 4-4 of FIG. 3 exemplified by the bottom view of FIG. 3 in a seventh embodiment of the present invention.

Referring now to FIG. 12, therein is shown a cross-sectional view of an integrated circuit packaging system 1200 along a line 4-4 of FIG. 3 exemplified by the bottom view of FIG. 3 in a seventh embodiment of the present invention. This embodiment shows the integrated circuit packaging system 300 with the addition of the mounting integrated circuit packaging system 1102, mounted above the integrated circuit packaging system 300 in a package on package configuration. The mounting integrated circuit packaging system 1102 includes an integrated circuit 1104, a package carrier 1106, and an encapsulation 1108.

The mounting integrated package system 1102 can include mounting interconnects 1110 that are formed to coincide with package interconnects 410. The mounting interconnects 1110 are defined as connection structures to electrically and mechanically connect and attach the integrated circuit packaging system 300 and the mounting integrated circuit packaging system 1102. Examples of mounting interconnects 1110 include solder bumps, conductive paste, or conductive posts.

The integrated circuit packaging system 1200 can be attached to a printed circuit board (PCB) (not shown) using external connectors 406. When the integrated circuit packaging system 1200 is mechanically and electrically attached to the PCB using a reflow process, the external connectors 406 can deform allowing the perimeter antiwarpage structure 302 to be in direct physical contact with the PCB at the same time the external connectors 406 provide a mechanical and electrical connection with the PCB and integrated circuit packaging system 1100.

The addition of the perimeter antiwarpage structure 302 can provide several functions. The perimeter antiwarpage structure 302 can add stiffness to the package carrier 304 during and after reflow of the external connectors 406. This stiffness minimizes the warpage of the package carrier 304 ensuring that the mechanical and electrical connection between the PCB and the integrated circuit packaging system 1200 is uniform. The perimeter antiwarpage structure 302 can add an additional mechanical connection between the integrated circuit packaging system 1200 and the PCB. This additional mechanical connection minimizes warpage of the integrated circuit packaging system 1200 during the many thermal cycles that the PCB may experience, thereby minimizing any physical stress on the integrated circuit packaging system 1200 which can cause premature electrical failure.

It has been discovered that the addition of the perimeter antiwarpage structure 302 greatly increases the reliability of the integrated circuit packaging system 1200 and the mechanical and electrical connection between the integrated circuit packaging system 1200 and the PCB. The antiwarpage structure 302 attached to the integrated packaging system 300 increases the structural rigidity of the integrated packaging system 300 which in turn increases the structural rigidity of the integrated packaging system 1200.

Figure 13:
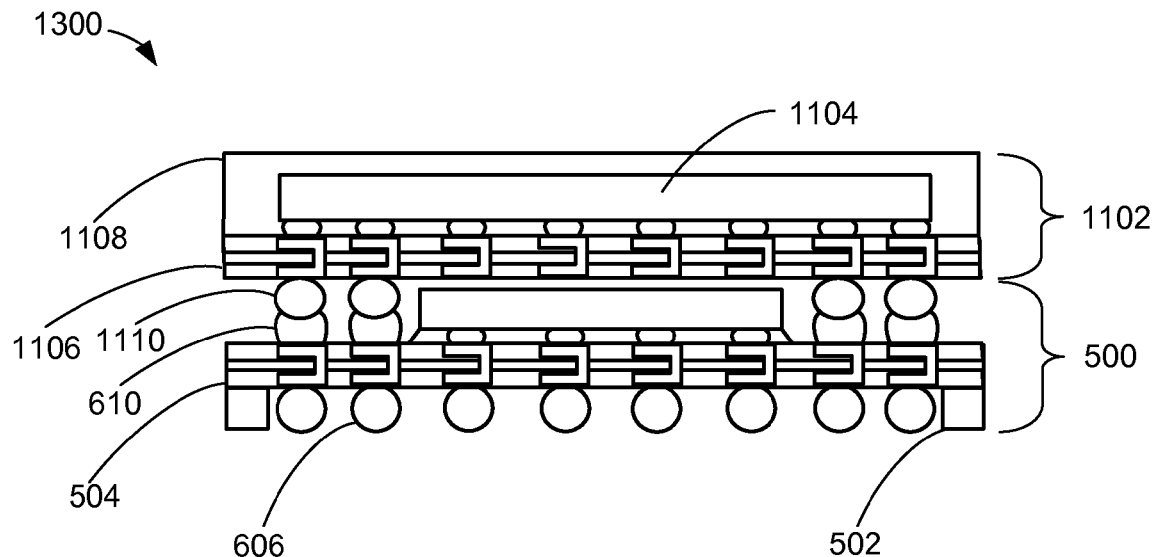
FIG. 13 is a cross-sectional view of an integrated circuit packaging system along a line 6-6 of FIG. 5 exemplified by the bottom view of FIG. 5 in an eighth embodiment of the present invention.

Referring now to FIG. 13, therein is shown a cross-sectional view of an integrated circuit packaging system 1300 along a line 6-6 of FIG. 5 exemplified by the bottom view of FIG. 5 in an eighth embodiment of the present invention. This embodiment shows the integrated circuit packaging system 500 with the addition of the mounting integrated circuit packaging system 1102, mounted above the integrated circuit packaging system 500 in a package on package configuration. The mounting integrated circuit packaging system 1102 includes an integrated circuit 1104, a package carrier 1106, and an encapsulation 1108.

The mounting integrated package system 1102 can include mounting interconnects 1110 that are formed to coincide with package interconnects 610. The mounting interconnects 1110 are defined as connection structures to electrically and mechanically connect and attach the integrated circuit packaging system 500 and the mounting integrated circuit packaging system 1102. Examples of mounting interconnects 1110 include solder bumps, conductive paste, or conductive posts.

The integrated circuit packaging system 1300 can be attached to a printed circuit board (PCB) (not shown) using external connectors 606. When the integrated circuit packaging system 1300 is mechanically and electrically attached to the PCB using a reflow process, the external connectors 606 can deform allowing the perimeter antiwarpage structure 502 to be in direct physical contact with the PCB at the same time the external connectors 606 provide a mechanical and electrical connection with the PCB and integrated circuit packaging system 1300.

The addition of the perimeter antiwarpage structure 502 can provide several functions. The perimeter antiwarpage structure 502 can add stiffness to the package carrier 504 during and after reflow of the external connectors 606. This stiffness minimizes the warpage of the package carrier 504 ensuring that the mechanical and electrical connection between the PCB and the integrated circuit packaging system 1300 is uniform. The perimeter antiwarpage structure 502 can add an additional mechanical connection between the integrated circuit packaging system 1300 and the PCB. This additional mechanical connection minimizes warpage of the integrated circuit packaging system 1300 during the many thermal cycles that the PCB may experience, thereby minimizing any physical stress on the integrated circuit packaging system 1300 which can cause premature electrical failure.

It has been discovered that the addition of the perimeter antiwarpage structure 502 greatly increases the reliability of the integrated circuit packaging system 1300 and the mechanical and electrical connection between the integrated circuit packaging system 1300 and the PCB. The antiwarpage structure 502 attached to the integrated packaging system 500 increases the structural rigidity of the integrated packaging system 500 which in turn increases the structural rigidity of the integrated packaging system 1300.

Figure 14:
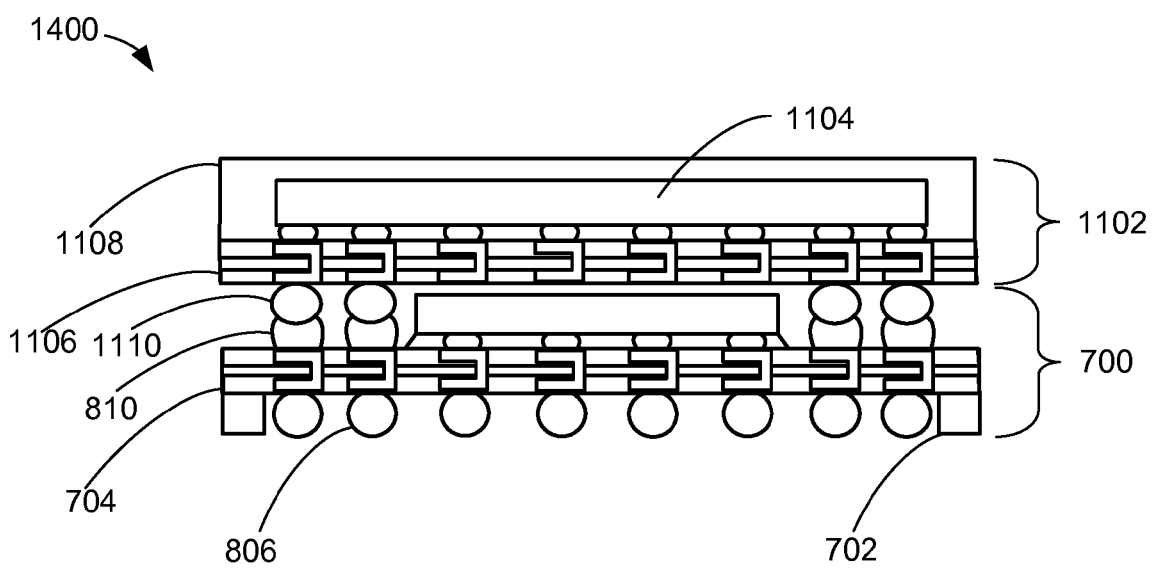
FIG. 14 is a cross-sectional view of an integrated circuit packaging system along a line 8-8 of FIG. 7 exemplified by the bottom view of FIG. 7 in a ninth embodiment of the present invention.

Referring now to FIG. 14, therein is shown a cross-sectional view of an integrated circuit packaging system 1400 along a line 8-8 of FIG. 7 exemplified by the bottom view of FIG. 7 in a ninth embodiment of the present invention. This embodiment shows the integrated circuit packaging system 700 with the addition of the mounting integrated circuit packaging system 1102, mounted above the integrated circuit packaging system 700 in a package on package configuration. The mounting integrated circuit packaging system 1102 includes an integrated circuit 1104, a package carrier 1106, and an encapsulation 1108.

The mounting integrated package system 1102 can include mounting interconnects 1110 that are formed to coincide with package interconnects 810. The mounting interconnects 1110 are defined as connection structures to electrically and mechanically connect and attach the integrated circuit packaging system 700 and the mounting integrated circuit packaging system 1102. Examples of mounting interconnects 1110 include solder bumps, conductive paste, or conductive posts.

The integrated circuit packaging system 1400 can be attached to a printed circuit board (PCB) (not shown) using external connectors 806. When the integrated circuit packaging system 1400 is mechanically and electrically attached to the PCB using a reflow process, the external connectors 806 can deform allowing the perimeter antiwarpage structure 702 to be in direct physical contact with the PCB at the same time the external connectors 806 provide a mechanical and electrical connection with the PCB and integrated circuit packaging system 1400.

The addition of the perimeter antiwarpage structure 702 can provide several functions. The perimeter antiwarpage structure 702 can add stiffness to the package carrier 704 during and after reflow of the external connectors 806. This stiffness minimizes the warpage of the package carrier 704 ensuring that the mechanical and electrical connection between the PCB and the integrated circuit packaging system 1400 is uniform. The perimeter antiwarpage structure 702 can add an additional mechanical connection between the integrated circuit packaging system 1400 and the PCB. This additional mechanical connection minimizes warpage of the integrated circuit packaging system 1400 during the many thermal cycles that the PCB may experience, thereby minimizing any physical stress on the integrated circuit packaging system 1400 which can cause premature electrical failure.

It has been discovered that the addition of the perimeter antiwarpage structure 702 greatly increases the reliability of the integrated circuit packaging system 1400 and the mechanical and electrical connection between the integrated circuit packaging system 1400 and the PCB. The antiwarpage structure 702 attached to the integrated packaging system 700 increases the structural rigidity of the integrated packaging system 700 which in turn increases the structural rigidity of the integrated packaging system 1400.

Figure 15:
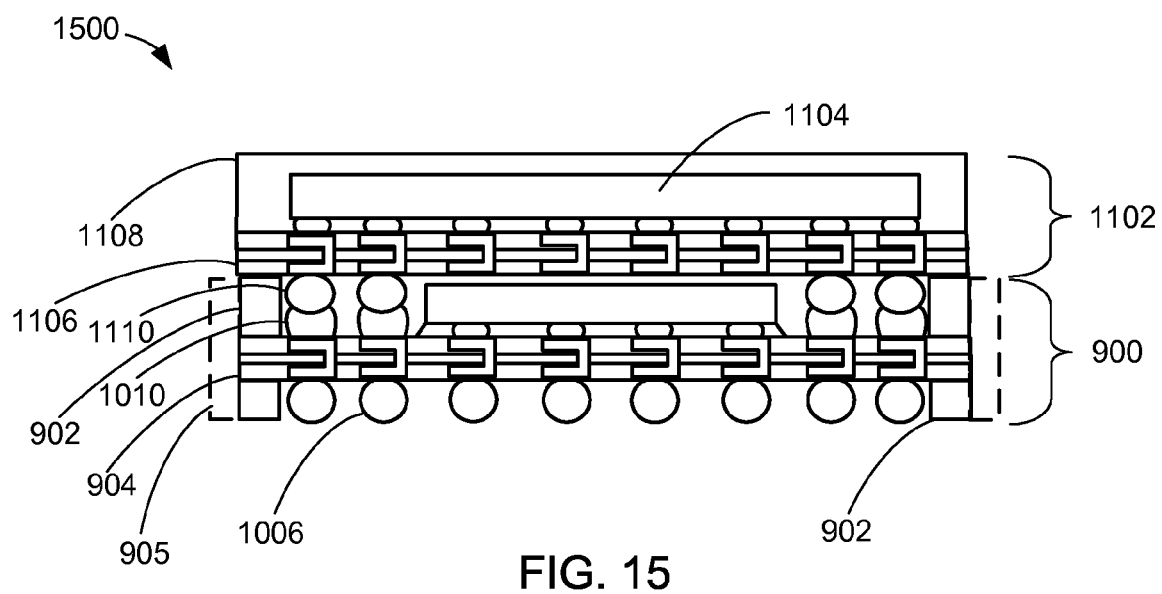
FIG. 15 is a cross-sectional view of an integrated circuit packaging system along a line 10-10 of FIG. 9 exemplified by the bottom view of FIG. 9 in a tenth embodiment of the present invention.

Referring now to FIG. 15, therein is shown a cross-sectional view of an integrated circuit packaging system 1500 along a line 10-10 of FIG. 9 exemplified by the bottom view of FIG. 9 in a tenth embodiment of the present invention.

This embodiment shows the integrated circuit packaging system 900 with the addition of the mounting integrated circuit packaging system 1102, mounted above the integrated circuit packaging system 900 in a package on package configuration. The mounting integrated circuit packaging system 1102 includes an integrated circuit 1104, a package carrier 1106, and an encapsulation 1108.

The mounting integrated package system 1102 can include mounting interconnects 1110 that are formed to coincide with package interconnects 1010. The mounting interconnects 1110 are defined as connection structures to electrically and mechanically connect and attach the integrated circuit packaging system 900 and the mounting integrated circuit packaging system 1102. Examples of mounting interconnects 1110 include solder bumps, conductive paste, or conductive posts.

The integrated circuit packaging system 1500 can be attached to a printed circuit board (PCB) (not shown) using external connectors 1006. When the integrated circuit packaging system 1500 is mechanically and electrically attached to the PCB using a reflow process, the external connectors 1006 can deform allowing the perimeter antiwarpage structure 902 and the side support 905 to be in direct physical contact with the PCB at the same time the external connectors 1006 provide a mechanical and electrical connection with the PCB and integrated circuit packaging system 1500.

The addition of the perimeter antiwarpage structure 902 and the side support 905 can provide several functions. The perimeter antiwarpage structure 902 and the side support 905 can add stiffness to the package carrier 904 during and after reflow of the external connectors 1006. This stiffness minimizes the warpage of the package carrier 904 ensuring that the mechanical and electrical connection between the PCB and the integrated circuit packaging system 1500 is uniform. The perimeter antiwarpage structure 902 and the side support 905 can add an additional mechanical connection between the integrated circuit packaging system 1500 and the PCB. This additional mechanical connection minimizes warpage of the integrated circuit packaging system 1500 during the many thermal cycles that the PCB may experience, thereby minimizing any physical stress on the integrated circuit packaging system 1500 which can cause premature electrical failure.

It has been discovered that the addition of the perimeter antiwarpage structure 902 and the side support 905 greatly increases the reliability of the integrated circuit packaging system 1500 and the mechanical and electrical connection between the integrated circuit packaging system 1500 and the PCB. The antiwarpage structure 902 and the side support 905 attached to the integrated packaging system 900 increases the structural rigidity of the integrated packaging system 900 which in turn increases the structural rigidity of the integrated packaging system 1500.

Figure 16:
FIG. 16 is a cross-sectional view of the integrated circuit packaging system of FIG. 1 in a manufacturing step with a carrier strip having the package carrier.

Referring now to FIG. 16, therein is shown a cross sectional view of the integrated circuit packaging system 100 of FIG. 1 in a manufacturing step with a carrier strip 1602 having the package carrier 104. The carrier strip 1602 is a series of laminated or ceramic substrates containing mechanical and electrical interconnects that are cut into individual package carriers 104. The package carrier 104 is a support structure providing a mounting structure to the internal contents of the integrated circuit packaging system 100 as well as conductive paths within, to, and out of the integrated circuit packaging system 100. As examples, the package carrier 104 can be a laminated substrate, a ceramic substrate, or a leadframe type carrier.

Figure 17:
FIG. 17 is the structure of FIG. 16 in a mounting step for the perimeter antiwarpage structure.

Referring now to FIG. 17, therein is shown the structure of FIG. 16 in a mounting step for the perimeter antiwarpage structure 102. The perimeter antiwarpage structure 102 is defined as a formed structure that is along the perimeter or a portion of the perimeter of the package carrier 104. The perimeter antiwarpage structure 102 is formed on the package carrier 104.

Figure 18:
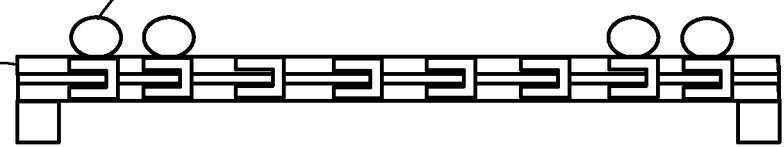
FIG. 18 is the structure of FIG. 17 in a mounting step for the package interconnects.

Referring now to FIG. 18, therein is shown the structure of FIG. 17 in a mounting step for the package interconnects 210. Package interconnects 210 can attach to the top of the package carrier 104 or at a side of the package carrier. The package interconnects 210 are defined as electrical connection structures providing electrical connection to the next system level (not shown).

Figure 19:
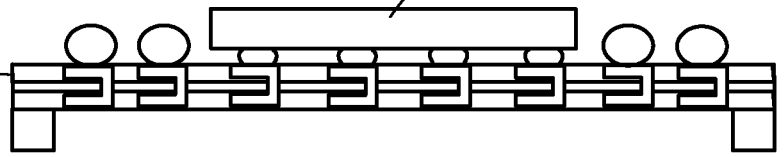
FIG. 19 is the structure of FIG. 18 in a mounting step for the integrated circuit.

Referring now to FIG. 19, therein is shown the structure of FIG. 18 in a mounting step for the integrated circuit 202. The integrated circuit 202 is mounted to and over the package carrier 104. The integrated circuit 202 is an active device having active circuitry fabricated thereon. Examples for the integrated circuit 202 can include an integrated circuit die, a packaged integrated circuit, a wafer chip scale package, or a flip chip.

Figure 20:
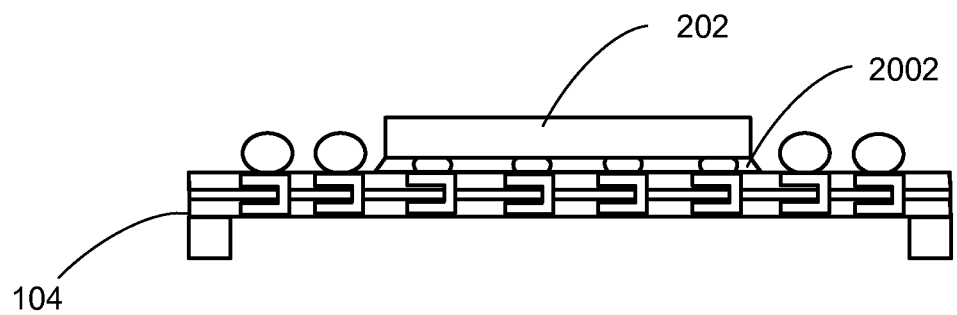
FIG. 20 is the structure of FIG. 19 in a mounting step for underfill.

Referring now to FIG. 20, therein is shown the structure of FIG. 19 in a mounting step for underfill 2002. The underfill 2002 is an encapsulation for the integrated circuit 202 and seals the connection between the integrated circuit 202 and the package carrier 104.

Figure 21:
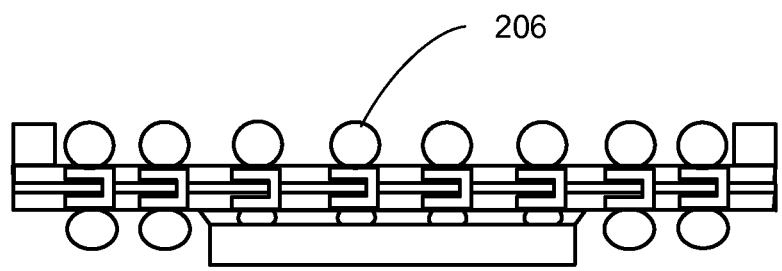
FIG. 21 is the structure of FIG. 20 in a mounting step for the external connectors.

Referring now to FIG. 21, therein is shown the structure of FIG. 20 in a mounting step for the external connectors 206. The integrated circuit packaging system 100 can be attached to a printed circuit board (PCB) (not shown) using external connectors 206. The external connectors 206 are defined as connection structures to electrically and mechanically connect and attach the integrated circuit packaging system 100 to the next system level. Examples of external connectors 206 include solder bumps, conductive paste, or conductive posts.

Figure 22:
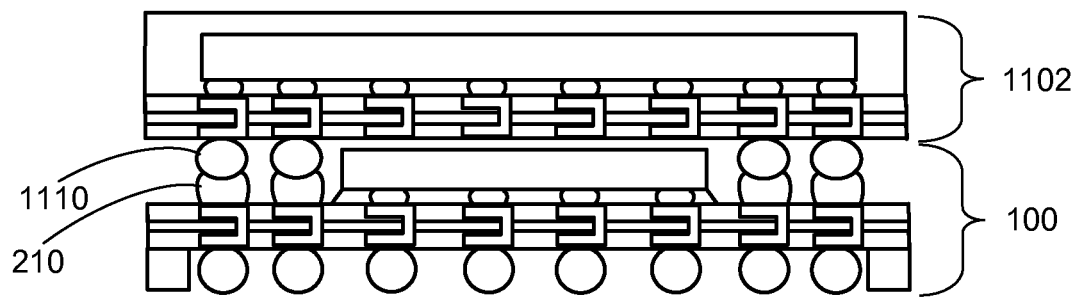
FIG. 22 is the structure of FIG. 21 in a mounting step for mounting integrated circuit package system.

Referring now to FIG. 22, therein is shown the structure of FIG. 21 in a mounting step for mounting integrated circuit package system 1102. The mounting integrated circuit package system 1102 can include mounting interconnects 1110 around the periphery that coincide with the locations of the package interconnects 210 of the integrated circuit packaging system 100.

The mounting integrated circuit package system 1102 and the integrated circuit packaging system 100 can then be mechanically and electrically connected using a reflow process to connect the package interconnects 1112 of the integrated circuit packaging system 100 with the mounting interconnects 210 of the mounting integrated circuit packaging system 1102.

Figure 23:
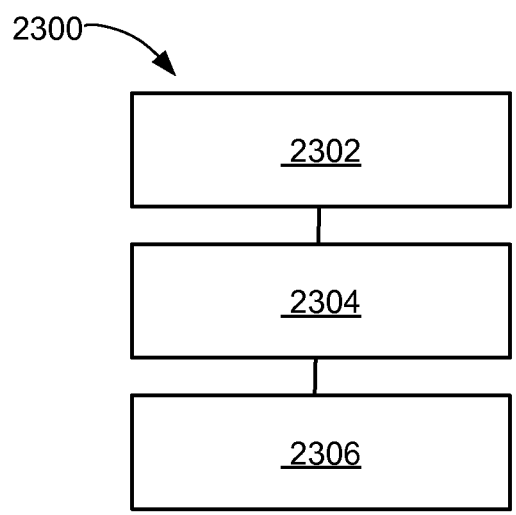
FIG. 23 is a flow chart of a method of manufacture of the integrated circuit packaging system in an embodiment of the present invention.

Referring now to FIG. 23, therein is shown a flow chart of a method 2300 of manufacture of the integrated circuit packaging system 100 in an embodiment of the present invention. The method 2300 includes: providing a package carrier in a block 2302; mounting an integrated circuit to the package carrier in a block 2304; and forming a perimeter antiwarpage structure on and along a perimeter of the package carrier in a block 2306.

Thus, it has been discovered that the integrated circuit packaging system of the present invention furnishes important and heretofore unknown and unavailable solutions, capabilities, and functional aspects for wiring technology for external connections. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing the integrated circuit packaging systems/fully compatible with conventional manufacturing methods or processes and technologies.

These and other valuable aspects of the present invention consequently further the state of the technology to at least the next level. While the invention has been described in conjunction with a specific best mode, it is to be understood that many alternatives, modifications, and variations will be apparent to those skilled in the art in light of the aforegoing description.

What is claimed is:

1. A method of manufacture of an integrated circuit packaging system comprising:
    providing a package carrier;
    mounting an integrated circuit to one side of the package carrier with an integrated circuit electrical connector;
    forming a perimeter antiwarpage structure on another side of the package carrier opposite from the integrated circuit and along a perimeter of the package carrier, the perimeter antiwarpage structure external to the package carrier; and
    forming an external connector on the side of the package carrier opposite from the integrated circuit and within a border of the perimeter antiwarpage structure, the external connector electrically connected to the integrated circuit electrical connectors on the opposite side of the package carrier from the integrated circuit, and the external connector extending below a bottom of a surface of the perimeter antiwarpage structure.

2. The method as claimed in claim 1 wherein forming the perimeter antiwarpage structure on the package carrier includes forming the perimeter antiwarpage structure on two opposing sides along the perimeter of the package carrier.

3. The method as claimed in claim 1 wherein forming the perimeter antiwarpage structure on the package carrier includes forming the perimeter antiwarpage structure along the perimeter of the package carrier and not in the corners.

4. The method as claimed in claim 1 wherein forming the perimeter antiwarpage structure on the package carrier includes forming the perimeter antiwarpage structure at a corner of the package carrier.

5. The method as claimed in claim 1 wherein forming the perimeter antiwarpage structure includes forming the perimeter antiwarpage structure with a side support at a perimeter on both sides of the package carrier.

6. A method of manufacture of an integrated circuit packaging system comprising:

providing a package carrier;

mounting an integrated circuit to one side of the package carrier with an integrated circuit electrical connector;

forming a perimeter antiwarpage structure on another side of the package carrier opposite from the integrated circuit and along a perimeter of the package carrier, the perimeter antiwarpage structure external to the package carrier;

forming an external connector on the side of the package carrier opposite from the integrated circuit and within a border of the perimeter antiwarpage structure, the external connector electrically connected to the integrated circuit electrical connectors on the opposite side of the package carrier from the integrated circuit, and the external connector extending below a bottom of a surface of the perimeter antiwarpage structure; and mounting a mounting integrated circuit packaging system above the integrated circuit packaging system.

7. The method as claimed in claim 6 wherein forming the perimeter antiwarpage structure on the package carrier includes forming a center cross support on the package carrier.

8. The method as claimed in claim 6 wherein forming the perimeter antiwarpage structure on the package carrier includes forming the perimeter antiwarpage structure around the entire perimeter of the package carrier and not in the corners.

9. The method as claimed in claim 6 wherein forming the perimeter antiwarpage structure on the package carrier includes forming the perimeter antiwarpage structure at a corner of the package carrier.

10. The method as claimed in claim 6 further comprising forming the perimeter antiwarpage structure on the package carrier includes forming the perimeter antiwarpage structure at a perimeter on both sides of the package carrier.

\* \* \* \* \*